United States Patent
Onuki (10) Patent No.: US 9,001,549 B2
(45) Date of Patent: Apr. 7, 2015

(54) SEMICONDUCTOR DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/890,002

(22) Filed: May 8, 2013

(65) Prior Publication Data

US 2013/0301332 A1  Nov. 14, 2013

(30) Foreign Application Priority Data

May 11, 2012 (JP) .................................. 2012-109286

(51) Int. Cl.
  *G11C 7/00*  (2006.01)
  *G11C 5/06*  (2006.01)
  *G11C 5/10*  (2006.01)
  *G11C 14/00*  (2006.01)

(52) U.S. Cl.
  CPC  *G11C 5/063* (2013.01); *G11C 5/10* (2013.01); *G11C 14/0063* (2013.01)

(58) Field of Classification Search
  CPC .......... G11C 16/0483; G11C 16/3418; G11C 11/5642; G11C 5/06; G11C 7/08
  USPC ............. 365/65, 117, 145, 149, 154, 189.05, 365/185.07, 185.08, 189.11, 203, 72, 205
  See application file for complete search history.

(56) References Cited

U.S. PATENT DOCUMENTS

| | | | |
|---|---|---|---|
| 6,285,575 B1 * | 9/2001 | Miwa | 365/145 |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,314,637 B2 | 11/2012 | Kato et al. | |
| 8,362,538 B2 | 1/2013 | Koyama et al. | |
| 8,410,838 B2 | 4/2013 | Kato et al. | |

(Continued)

FOREIGN PATENT DOCUMENTS

| | | |
|---|---|---|
| JP | 2007-096055 A | 4/2007 |
| JP | 2007-108402 A | 4/2007 |
| JP | 2007-123861 A | 5/2007 |

OTHER PUBLICATIONS

Takanori Matsuzaki et al.; "1 Mb Non-Volatile Random Access Memory Using Oxide Semiconductor"; IMW 2011 (3rd IEEE International Memory Workshop); 2011; pp. 185-188.

*Primary Examiner* — Michael Tran
(74) *Attorney, Agent, or Firm* — Fish & Richardson P.C.

(57) ABSTRACT

To provide a semiconductor device with high reliability in operation, in which data in a volatile memory can be saved to a non-volatile memory. For example, the semiconductor device includes an SRAM provided with first and second data storage portions and a non-volatile memory provided with third and fourth data storage portions. The first data storage portion is electrically connected to the fourth data storage portion through a transistor, and the second data storage portion is electrically connected to the third data storage portion through a transistor. The transistors are turned off when the SRAM operates, and the transistors are turned on when the SRAM does not operate, so that data in the SRAM is saved to the non-volatile memory. Precharge is performed when the SRAM is restored.

10 Claims, 5 Drawing Sheets

(56) References Cited

U.S. PATENT DOCUMENTS

| | | |
|---|---|---|
| 8,432,187 B2 | 4/2013 | Kato et al. |
| 8,787,102 B2 | 7/2014 | Ishizu |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0305461 A1 | 12/2009 | Akimoto et al. |
| 2010/0136743 A1 | 6/2010 | Akimoto et al. |
| 2010/0238744 A1* | 9/2010 | Yano ........................ 365/189.11 |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0156024 A1* | 6/2011 | Koyama et al. ................. 257/43 |
| 2011/0163311 A1 | 7/2011 | Akimoto et al. |
| 2011/0187410 A1* | 8/2011 | Kato et al. ...................... 326/46 |
| 2013/0057315 A1 | 3/2013 | Kato et al. |
| 2013/0301331 A1 | 11/2013 | Onuki |

* cited by examiner

SEMICONDUCTOR DEVICE

BACKGROUND OF THE INVENTION

1. Field of the Invention

The present invention relates to a semiconductor device and a driving method thereof. In this specification, a semiconductor device refers to a semiconductor element itself or a device including a semiconductor element. A transistor can be given as an example of such a semiconductor element. Therefore, the semiconductor device includes a liquid crystal display device, a memory device, and the like in its category.

2. Description of the Related Art

As a kind of volatile memory, a static random access memory (SRAM) is widely known. For example, disclosed in Patent Document 1 is a semiconductor integrated circuit in which data in an SRAM is saved to an external context storage unit, so that power consumption and start-up time can be reduced.

Meanwhile, in recent years, metal oxides having semiconductor characteristics (hereinafter referred to as oxide semiconductors) have attracted attention. Oxide semiconductors can be applied to transistors (see Patent Documents 2 and 3).

REFERENCE

Patent Document

[Patent Document 1] Japanese Published Patent Application No. 2007-108402
[Patent Document 2] Japanese Published Patent Application No. 2007-123861
[Patent Document 3] Japanese Published Patent Application No. 2007-096055

SUMMARY OF THE INVENTION

An object of one embodiment of the present invention is to provide a memory device (semiconductor device) which includes a data storage portion electrically connected to a transistor having low off-state current and a volatile memory (e.g., SRAM) electrically connected to the data storage portion.

Another object of one embodiment of the present invention is to provide a memory device (semiconductor device) with high reliability in operation, in which data in a volatile memory can be saved to a non-volatile memory.

One embodiment of the present invention is a semiconductor device in which a data storage portion in a first memory circuit is electrically connected to a data storage portion in a second memory circuit through a transistor. In driving such a semiconductor device, the transistor is kept off in a period during which power is supplied to the first memory circuit and the transistor is turned on in saving data before the power supply to the first memory circuit is stopped. Whether power is supplied or not is determined for each element or block. For restoration, the data storage portion in the first memory circuit is precharged.

One embodiment of the present invention is a semiconductor device including a plurality of memory elements arranged in a matrix, each memory element including a first memory circuit provided with a first data storage portion and a second data storage portion, and a second memory circuit provided with a third data storage portion and a fourth data storage portion. The first data storage portion is electrically connected to a bit line through a first transistor, the second data storage portion is electrically connected to an inverted bit line through a second transistor, the first transistor and the second transistor are electrically connected to a first word line, the third data storage portion is electrically connected to the second data storage portion through a third transistor, the fourth data storage portion is electrically connected to the first data storage portion through a fourth transistor, the third transistor and the fourth transistor are electrically connected to a second word line, the third data storage portion and the fourth data storage portion are electrically connected to one electrode of a capacitor, and the other electrode of the capacitor is electrically connected to a low potential power source line. The semiconductor device also includes a unit for saving data in the first data storage portion and the second data storage portion to the third data storage portion and the fourth data storage portion immediately before the supply of power to the first memory circuit is stopped, and a unit for precharging the first data storage portion and the second data storage portion in restoring the first memory circuit, thereby reading data from the third data storage portion and the fourth data storage portion to the first data storage portion and the second data storage portion.

Another embodiment of the present invention is a semiconductor device including a plurality of memory elements arranged in a matrix, each memory element including a first memory circuit provided with a first data storage portion and a second data storage portion, and a second memory circuit provided with a third data storage portion. The first data storage portion is electrically connected to a bit line through a first transistor, the second data storage portion is electrically connected to an inverted bit line through a second transistor, the first transistor and the second transistor are electrically connected to a first word line, the third data storage portion is electrically connected to the second data storage portion through a third transistor, the third transistor is electrically connected to a second word line, the third data storage portion is electrically connected to one electrode of a capacitor, and the other electrode of the capacitor is electrically connected to a low potential power source line. The semiconductor device also includes a unit for saving data in the second data storage portion to the third data storage portion immediately before the supply of power to the first memory circuit is stopped, and a unit for precharging the first data storage portion and the second data storage portion in restoring the first memory circuit, thereby reading data from the third data storage portion to the second data storage portion.

In the semiconductor device of one embodiment of the present invention, the first data storage portion and the second data storage portion are preferably precharged to a potential intermediate between a potential of a high potential power source line and a potential of a low potential power source line.

In the semiconductor device of one embodiment of the present invention, when the low potential power source line has a ground potential, the first data storage portion and the second data storage portion may be precharged to a potential equal to a difference between the potential of the high potential power source line Vdd and the ground potential, namely, half the potential of the high potential power source line.

In the semiconductor device of one embodiment of the present invention, each of the first transistor and the second transistor preferably includes a silicon region.

In the semiconductor device of one embodiment of the present invention, each of the third transistor and the fourth transistor preferably includes an oxide semiconductor region.

In the semiconductor device of one embodiment of the present invention, the third transistor and the fourth transistor are preferably provided over the first transistor and the second transistor.

It is possible to achieve a memory device (semiconductor device) including a data storage portion connected to a transistor with low off-state current, and a first memory circuit connected to the data storage portion.

Data in the first memory circuit can be saved to a second memory circuit, whereby a memory device (semiconductor device) with high reliability in operation can be achieved.

DETAILED DESCRIPTION OF THE INVENTION

Hereinafter, embodiments of the present invention will be described in detail with reference to the accompanying drawings. Note that the present invention is not limited to the following description and it is easily understood by those skilled in the art that the mode and details can be changed in various ways without departing from the scope and spirit of the present invention. Therefore, the present invention should not be construed as being limited to the description of the embodiments below.

(Embodiment 1)

In this embodiment, a semiconductor device which is one embodiment of the present invention, and a driving method of the semiconductor device will be described.

Figure 1:
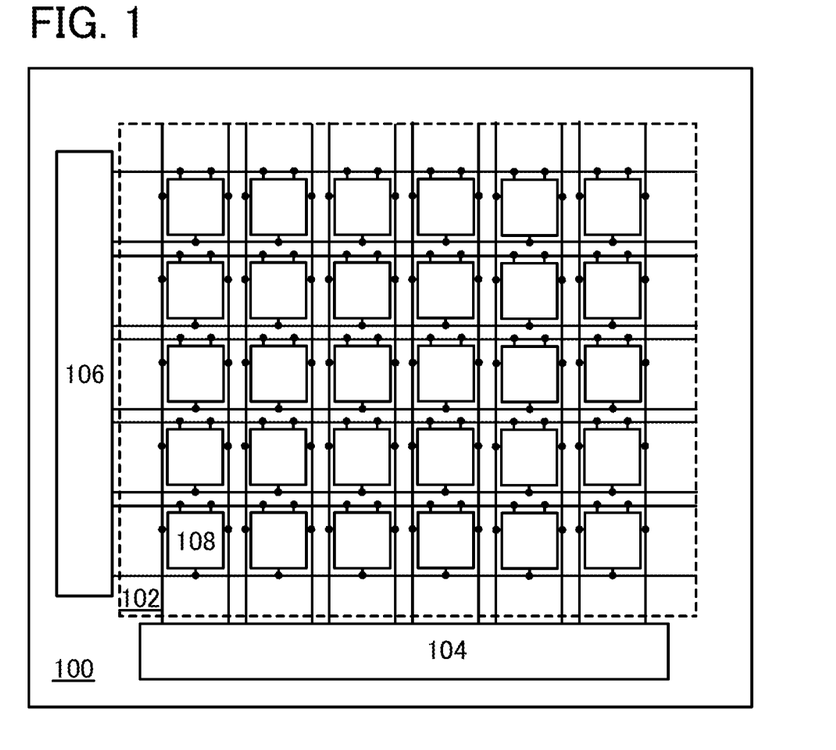
FIG. 1 is a block diagram illustrating a semiconductor device which is one embodiment of the present invention.

FIG. 1 illustrates a memory device 100 as the semiconductor device which is one embodiment of the present invention. The memory device 100 illustrated in FIG. 1 includes a memory element portion 102, a first driver circuit 104, and a second driver circuit 106.

A plurality of memory elements 108 are arranged in a matrix in the memory element portion 102. In the example illustrated in FIG. 1, the memory elements 108 are arranged in five rows and six columns in the memory element portion 102.

The first driver circuit 104 and the second driver circuit 106 control the supply of signals to the memory elements 108, and receive signals from the memory elements 108 in reading. For example, the first driver circuit 104 serves as a word line driver circuit and the second driver circuit 106 serves as a bit line driver circuit. Note that one embodiment of the present invention is not limited thereto, and the first driver circuit 104 and the second driver circuit 106 may serve as a bit line driver circuit and a word line driver circuit, respectively.

The first driver circuit 104 and the second driver circuit 106 are each electrically connected to the memory elements 108 through wirings.

Figure 2:
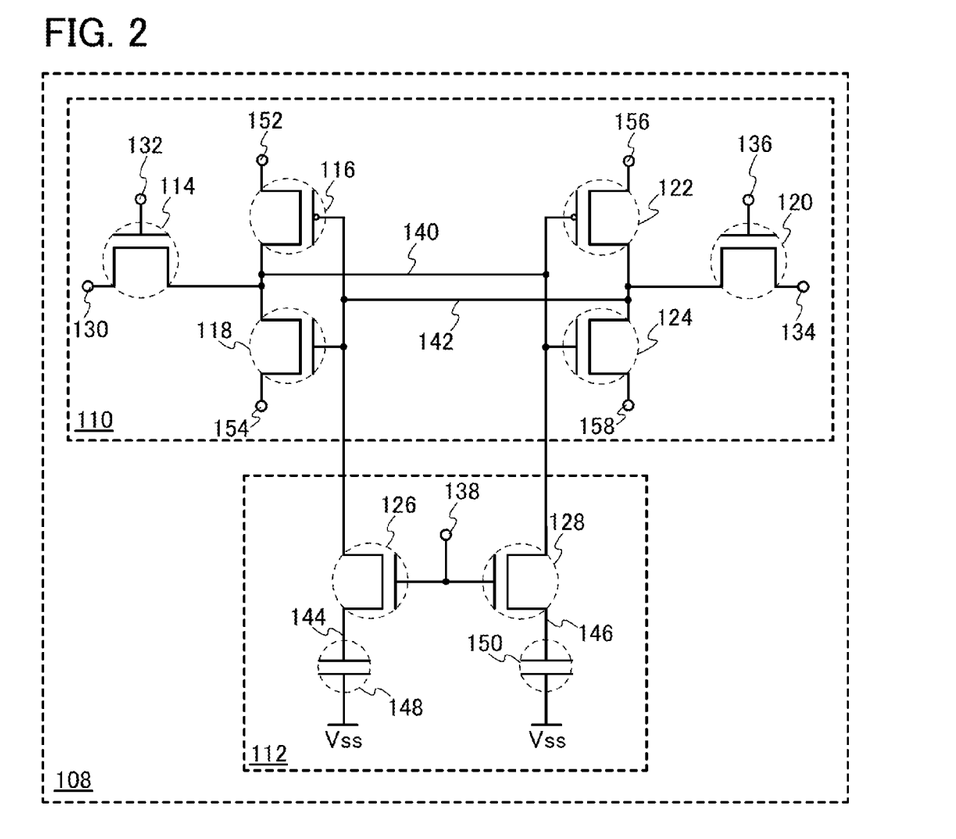
FIG. 2 is a circuit diagram illustrating a semiconductor device which is one embodiment of the present invention.

The memory elements 108 each include a volatile memory and a non-volatile memory. FIG. 2 illustrates an example of a specific circuit configuration of the memory element 108. The memory element 108 illustrated in FIG. 2 includes a first memory circuit 110 and a second memory circuit 112.

The first memory circuit 110 includes a first transistor 114, a second transistor 116, a third transistor 118, a fourth transistor 120, a fifth transistor 122, and a sixth transistor 124.

First, a configuration of the first memory circuit 110 is described. One of a source and a drain of the first transistor 114 is electrically connected to a first terminal 130, and a gate of the first transistor 114 is electrically connected to a second terminal 132. One of a source and a drain of the second transistor 116 is electrically connected to a sixth terminal 152, and the other of the source and the drain of the second transistor 116 is electrically connected to the other of the source and the drain of the first transistor 114, one of a source and a drain of the third transistor 118, and a first data storage portion 140. The other of the source and the drain of the third transistor 118 is electrically connected to a seventh terminal 154. A gate of the second transistor 116 and a gate of the third transistor 118 are electrically connected to a second data storage portion 142.

One of a source and a drain of the fourth transistor 120 is electrically connected to a third terminal 134. A gate of the fourth transistor 120 is electrically connected to a fourth terminal 136. One of a source and a drain of the fifth transistor 122 is electrically connected to an eighth terminal 156, and the other of the source and the drain of the fifth transistor 122 is electrically connected to the other of the source and the drain of the fourth transistor 120, one of a source and a drain of the sixth transistor 124, and the second data storage portion 142. The other of the source and the drain of the sixth transistor 124 is electrically connected to a ninth terminal 158. A gate of the fifth transistor 122 and a gate of the sixth transistor 124 are electrically connected to the first data storage portion 140.

Note that the sixth terminal 152 and the eighth terminal 156 have a potential of a high potential power source line Vdd when the first memory circuit 110 operates, and have a precharge potential at the time of precharge described later. The seventh terminal 154 and the ninth terminal 158 have a potential of a low potential power source line Vss when the first memory circuit 110 operates, and have a potential to be precharged at the time of precharge described later.

The first transistor 114, the third transistor 118, the fourth transistor 120, and the sixth transistor 124 are n-channel transistors.

The second transistor 116 and the fifth transistor 122 are p-channel transistors.

The first terminal 130 is electrically connected to a bit line. The second terminal 132 is electrically connected to a first word line. The third terminal 134 is electrically connected to an inverted bit line. The fourth terminal 136 is electrically connected to the first word line.

The first memory circuit 110 having the above-described configuration is an SRAM. That is, the first memory circuit 110 is a volatile memory. In the memory device 100 which is one embodiment of the present invention, the first data storage portion 140 and the second data storage portion 142, which are provided in the first memory circuit 110, are electrically connected to the second memory circuit 112.

The second memory circuit 112 includes a seventh transistor 126 and an eighth transistor 128.

Next, a configuration of the second memory circuit 112 is described. One of a source and a drain of the seventh transistor 126 is electrically connected to the second data storage portion 142. The other of the source and the drain of the seventh transistor 126 is electrically connected to one electrode of a first capacitor 148. The other electrode of the first capacitor 148 is electrically connected to the low potential power source line Vss. One of a source and a drain of the eighth transistor 128 is electrically connected to the first data storage portion 140. The other of the source and the drain of the eighth transistor 128 is electrically connected to one electrode of a second capacitor 150. The other electrode of the second capacitor 150 is electrically connected to the low potential power source line Vss. A gate of the seventh transistor 126 and a gate of the eighth transistor 128 are electrically connected to a fifth terminal 138.

The fifth terminal 138 is electrically connected to a second word line. Note that a signal of one of the first word line and the second word line may be controlled by the operation of the other, or alternatively, they may be controlled independently from each other.

The seventh transistor 126 and the eighth transistor 128 are each a transistor having low off-state current. In the configuration illustrated in FIG. 2, the seventh transistor 126 and the eighth transistor 128 are n-channel transistors; however, one embodiment of the present invention is not limited thereto.

A third data storage portion 144 is formed between the seventh transistor 126 and the one electrode of the first capacitor 148. A fourth data storage portion 146 is formed between the eighth transistor 128 and the one electrode of the second capacitor 150. Since the seventh transistor 126 and the eighth transistor 128 each have low off-state current, charge in the third data storage portion 144 and the fourth data storage portion 146 can be stored for a long time. That is, the second memory circuit 112 is a non-volatile memory.

In each of the seventh transistor 126 and the eighth transistor 128, the off-state current per micrometer of channel width is preferably lower than or equal to 10 aA ($1 \times 10^{-17}$ A). The off-state current per micrometer of channel width of each of the transistors having low off-state current is preferably lower than or equal to 1 aA ($1 \times 10^{-18}$ A), more preferably lower than or equal to 10 zA ($1 \times 10^{-20}$ A), still more preferably lower than or equal to 1 zA ($1 \times 10^{-21}$ A), and yet still more preferably lower than or equal to 100 yA ($1 \times 10^{-22}$ A).

As described above, the first memory circuit 110 is a volatile memory and the second memory circuit 112 is a non-volatile memory. The first data storage portion 140 and the second data storage portion 142, which are the data storage portions in the first memory circuit 110, are electrically connected to the third data storage portion 144 and the fourth data storage portion 146, which are the data storage portions in the second memory circuit 112, through the transistors each having low off-state current. Accordingly, the data in the first memory circuit 110 can be saved to the data storage portion in the second memory circuit 112.

In the above manner, the memory element 108 illustrated in FIG. 2 is advantageous in that data in the first memory circuit can be saved.

Since the first memory circuit 110 is an SRAM, it needs to operate at high speed. On the contrary, the second memory circuit 112 needs to store data for a long time after the supply of power is stopped. Such a configuration can be realized by, for example, forming the first memory circuit 110 using a single crystal silicon substrate (also referred to as a silicon region) and forming the second memory circuit 112 using an oxide semiconductor (also referred to as an oxide semiconductor region). For an example of such a configuration, Embodiment 2 is referred to.

Note that the seventh transistor 126 and the eighth transistor 128 are turned off as appropriate because the second memory circuit 112 might inhibit high-speed operation of the first memory circuit 110.

Since data in the first memory circuit 110 is saved to the second memory circuit 112, the memory element 108 illustrated in FIG. 2 can be restored by reading data from the second memory circuit 112 even when the supply of power to the first memory circuit 110 is stopped in order to, for example, reduce power consumption. However, when the supply of power to the first memory circuit 110 in the memory element 108 is stopped, at least the data in the first memory circuit 110 is erased, whereby the potentials of the data storage portions in the first memory circuit 110, namely, the potentials of the first data storage portion 140 and the second data storage portion 142, are lowered to the potential of the low potential power source line Vss (e.g., ground potential). Although the restoration operation can be performed in this state, one embodiment of the present invention provides a unit with high reliability in operation.

The semiconductor device of one embodiment of the present invention includes a unit for precharging the first data storage portion 140 and the second data storage portion 142 immediately before the restoration operation. Specifically, the first data storage portion 140 and the second data storage portion 142 are preferably precharged to a potential intermediate between the potential of the high potential power source line Vdd after the restoration and the potential of the low potential power source line Vss.

The first data storage portion 140 and the second data storage portion 142 are precharged to such a potential (hereinafter, a precharge potential is also denoted as Vpre). For example, in the case where the third data storage portion 144 is at low potential (Low or L) and the fourth data storage portion 146 is at high potential (High or H), when the seventh transistor 126 and the eighth transistor 128 are turned on, the potential of the second data storage portion 142 is lowered (hereinafter, the absolute value of a lowered potential is also denoted as $\beta$) and the potential of the first data storage portion 140 is raised (hereinafter, the absolute value of a raised potential is also denoted as $\alpha$). That is to say, in the case where precharge is not performed, the first data storage portion 140 has a potential of Vss+$\alpha$ and the second data storage portion 142 has a potential of Vss at the time of restoration; in the case where precharge is performed, the first data storage portion 140 has a potential of Vpre+$\alpha$ and the second data storage portion 142 has a potential of Vpre–$\beta$ at the time of restoration.

Meanwhile, in the case where the third data storage portion 144 is at high potential (High or H) and the fourth data storage portion 146 is at low potential (Low or L), when the seventh transistor 126 and the eighth transistor 128 are turned on, the potential of the second data storage portion 142 is raised and the potential of the first data storage portion 140 is lowered. That is to say, in the case where precharge is not performed, the first data storage portion 140 has a potential of Vss and the second data storage portion 142 has a potential of Vss+$\alpha$ at the time of restoration; in the case where precharge is performed, the first data storage portion 140 has a potential of Vpre–$\beta$ and the second data storage portion 142 has a potential of Vpre+$\alpha$ at the time of restoration.

Hence, in any case, precharge results in an increase in the difference between the potential of the first data storage portion 140 and the potential of the second data storage portion 142 by a lowered potential of the data storage portion with low potential (Low or L). Accordingly, the data in the third data storage portion 144 and the fourth data storage portion 146 can be determined with high reliability.

Figure 3:
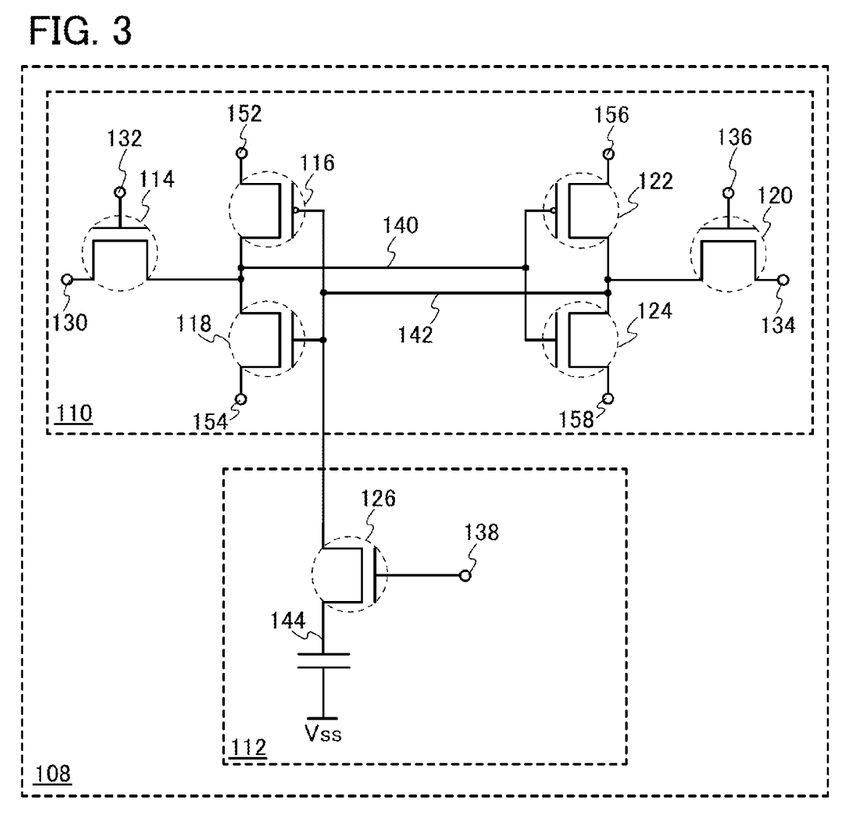
FIG. 3 is a circuit diagram illustrating a semiconductor device which is one embodiment of the present invention.

Note that such precharge enables simplification of the configuration of the memory element 108. That is, the second memory circuit 112 does not need to include the seventh transistor 126, the third data storage portion 144, and the first capacitor 148, or the eighth transistor 128, the fourth data storage portion 146, and the second capacitor 150. FIG. 3 illustrates a configuration where the eighth transistor 128, the fourth data storage portion 146, and the second capacitor 150 are not provided.

For example, in the case where precharge is not performed in the configuration of FIG. 3 in which the eighth transistor 128, the fourth data storage portion 146, and the second capacitor 150 are not provided, when the third data storage portion 144 is at low potential (Low or L), the second data storage portion 142 is at low potential (Low or L) immediately before restoration. Therefore, the potential of the second data storage portion 142 is not changed even when the seventh transistor 126 is turned on, which causes a problem in that the stored data cannot be determined. The data can be determined by performing precharge in the above manner; thus, the configuration of FIG. 3 can be employed. The configuration of FIG. 3 results in a reduction in the area occupied by the memory element 108.

Note that the precharging unit may be included in the first driver circuit 104, the second driver circuit 106, or the like, or may be included in another external control circuit. In the case where a precharge circuit or the like is used as the precharging unit, a simple circuit configuration is preferably used. For example, in the case where the low potential power source line has a ground potential (Vss=0), a potential intermediate between the potential of the high potential power source line Vdd and the potential of the low potential power source line Vss is |Vdd/2|. In that case, two resistors having the same resistance may be provided between the high potential power source line Vdd and the low potential power source line Vss so that the potential between the two resistors is used.

As described above, the memory device 100 can be operated with high reliability. Furthermore, data can be restored without fail even when the SRAM is turned off, and data is saved only to part of the memory elements, leading to a reduction in power consumption.

Although the SRAM is used as the first memory circuit, one embodiment of the present invention is not limited thereto and other volatile memories may be employed.
(Embodiment 2)

In this embodiment, an example of the structure of a semiconductor device which is one embodiment of the present invention will be described.

First, examples of the structure of a transistor which has low off-state current and can be used in a semiconductor device of one embodiment of the present invention are described with reference to schematic cross-sectional views of FIGS. 4A and 4B. Note that components illustrated in FIGS. 4A and 4B are not to scale in some cases.

Figure 4A:
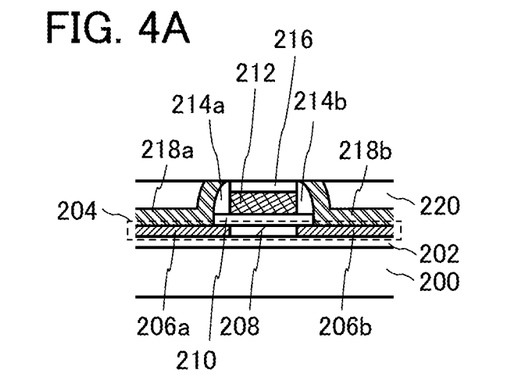
FIGS. 4A and 4B are cross-sectional views each illustrating a semiconductor device which is one embodiment of the present invention.
Figure 4B:
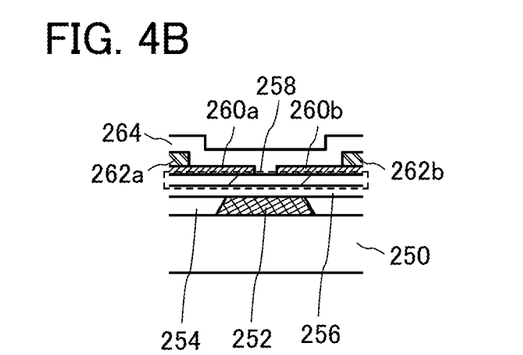

The transistor illustrated in FIG. 4A includes a semiconductor layer 204, an insulating layer 210, a conductive layer 212, an insulating layer 214a, an insulating layer 214b, an insulating layer 216, a conductive layer 218a, a conductive layer 218b, and an insulating layer 220.

The semiconductor layer 204 is provided over an element formation layer 200 with an insulating layer 202 interposed therebetween. Note that one embodiment of the present invention is not limited thereto, and the semiconductor layer 204 may be provided directly on the element formation layer 200.

The semiconductor layer 204 includes regions 206a and 206b to which dopants are added, and a channel formation region 208 between the regions 206a and 206b.

The insulating layer 210 is provided over part of the semiconductor layer 204.

The conductive layer 212 is provided to overlap the semiconductor layer 204 with the insulating layer 210 interposed therebetween.

The insulating layers 214a and 214b are sidewall insulating layers provided in contact with side surfaces of the conductive layer 212.

The insulating layer 216 is provided over the conductive layer 212.

The conductive layer 218a is provided in contact with the region 206a, and the conductive layer 218b is provided in contact with the region 206b. The conductive layer 218a is provided also in contact with a side surface of the insulating layer 214a. The conductive layer 218b is provided also in contact with a side surface of the insulating layer 214b.

The insulating layer 220 is provided over the conductive layers 218a and 218b.

The conductive layers 218a and 218b and the insulating layer 220 are formed by CMP treatment, for example.

The transistor illustrated in FIG. 4B includes a conductive layer 252, an insulating layer 254, an insulating layer 256, a semiconductor layer 258, a conductive layer 260a, a conductive layer 260b, a conductive layer 262a, a conductive layer 262b, and an insulating layer 264.

The conductive layer 252 is provided over an element formation layer 250.

The insulating layer 254 is provided over the element formation layer 250. Surfaces of the conductive layer 252 and the insulating layer 254 are preferably flat.

The conductive layer 252 and the insulating layer 254 are formed by CMP treatment, for example.

The insulating layer 256 is provided over the conductive layer 252 and the insulating layer 254.

The semiconductor layer 258 is provided to overlap the conductive layer 252 with the insulating layer 256 interposed therebetween.

The conductive layers 260a and 260b are provided in contact with the semiconductor layer 258. At this time, the distance between the conductive layers 260a and 260b, which corresponds to a channel length of the transistor, is preferably less than 50 nm. The distance between the conductive layers 260a and 260b can be made less than 50 nm in such a manner that part of a conductive film is etched using a resist mask formed by electron beam exposure. The distance between the conductive layers 260a and 260b is preferably less than the distance between the conductive layers 262a and 262b as illustrated in FIG. 4B.

The conductive layer 262a is provided on and in contact with part of the conductive layer 260a, and the conductive layer 262b is provided on and in contact with part of the conductive layer 260b. The electric resistance per unit area of the conductive layers 262a and 262b is preferably lower than the electric resistance per unit area of the conductive layers 260a and 260b.

The insulating layer 264 is provided to cover the semiconductor layer 258.

Next, each component illustrated in FIGS. 4A and 4B is described. Note that each of these components may have a single layer or a stack of a plurality of layers.

The insulating layer 202 is a base layer. The insulating layer 202 may be formed using a material such as gallium oxide, silicon oxide, silicon nitride, silicon oxynitride, silicon nitride oxide, aluminum oxide, aluminum nitride, aluminum oxynitride, aluminum nitride oxide, or hafnium oxide, for example.

The insulating layer 254 may be formed using a material similar to that of the insulating layer 202.

The semiconductor layers 204 and 258 are layers in each of which a channel of the transistor is formed (channel formation layers). The semiconductor layer 204 in FIG. 4A and the semiconductor layer 258 in FIG. 4B will be described below.

As each of the semiconductor layers 204 and 258, for example, an oxide semiconductor layer (also referred to as an oxide semiconductor region) can be used.

The oxide semiconductor layer is in a single crystal state, a polycrystalline (also referred to as polycrystal) state, an amorphous state, or the like. Alternatively, the oxide semiconductor layer may be a stack of an amorphous layer and a layer including crystals.

Examples of an oxide semiconductor are a metal oxide containing zinc and at least one of indium and gallium, and the metal oxide in which gallium is partly or entirely replaced with another metal element.

As the metal oxide, an In-based metal oxide, a Zn-based metal oxide, an In—Zn-based metal oxide, or an In—Ga—Zn-based metal oxide can be used, for example. Alternatively, a metal oxide including another metal element instead of part or all of gallium in the In—Ga—Zn-based metal oxide may be used.

As the another metal element, for example, a metal element that is capable of combining with more oxygen atoms than gallium can be used, and one or more elements of titanium, zirconium, hafnium, germanium, and tin can be used, for instance. Alternatively, as the another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all of gallium contained in the In—Ga—Zn-based metal oxide, an In—Sn—Zn-based metal oxide is obtained. When titanium replaces part of gallium contained in the In—Ga—Zn-based metal oxide, an In—Ti—Ga—Zn-based metal oxide is obtained.

Hereinafter, a structure of the oxide semiconductor film will be described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described. The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

According to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φscan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In the transistor using the CAAC-OS film, change in electrical characteristics due to irradiation with visible light or ultraviolet light is small.

Next, a microcrystalline oxide semiconductor film will be described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a probe diameter larger than that of a crystal part, a peak which shows a crystal plane does not appear. Further, a halo pattern is shown in a selected-area electron diffraction image of the nc-OS film obtained by using an electron beam having a probe diameter (e.g., larger than or equal to 50 nm) larger than that of a crystal part. Meanwhile, spots are shown in a nanobeam electron diffraction image of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor layer is used as the semiconductor layers 204 and 258, it is preferable that the oxide semiconductor layer be highly purified in the following manner: impurities such as hydrogen, water, a hydroxyl group, and a hydride (also referred to as a hydrogen compound) are removed from the oxide semiconductor layer by dehydration or dehydrogenation, and oxygen is supplied to the oxide semiconductor layer. For example, the oxide semiconductor layer can be highly purified by forming a layer containing oxygen in contact with the oxide semiconductor layer, and then performing heat treatment.

In addition, the oxide semiconductor layer just after the deposition is preferably supersaturated with oxygen so that the proportion of oxygen is higher than that in the stoichiometric composition. For example, in the case where the oxide semiconductor layer is deposited by a sputtering method, the deposition is preferably performed under the condition where the proportion of oxygen in a deposition gas is large, in particular, in an oxygen atmosphere (oxygen gas: 100%). Further, in order that the oxide semiconductor layer is supersaturated with oxygen by sufficient supply of oxygen, an insulating layer containing excess oxygen ($SiO_x$ (x>2)) may be provided as the insulating layer in contact with the oxide semiconductor layer (e.g., the insulating layers 202, 210, 256, and 264).

The insulating layer containing excess oxygen is formed by adjusting the deposition condition for a PCVD method, a plasma sputtering method, or another sputtering method so that a large amount of oxygen is contained. In order to make the insulating layer contain much more excess oxygen, oxygen is added by an ion implantation method, an ion doping method, or plasma treatment. Moreover, oxygen may be added to the oxide semiconductor layer.

Further, an entrapment vacuum pump is preferably used for a sputtering apparatus in the formation of the oxide semiconductor layer. This is because the amount of moisture remaining in the deposition chamber is preferably small. Further, the sputtering apparatus may be provided with a cold trap.

The oxide semiconductor layer is preferably subjected to heat treatment at a substrate temperature higher than or equal to 350° C. and less than the strain point of a substrate, preferably higher than or equal to 350° C. and lower than or equal to 450° C. Heat treatment may be further performed in a later step. There is no particular limitation on a heat treatment apparatus to be used here, and an electric furnace or an a rapid thermal annealing (RTA) apparatus such as a gas rapid thermal annealing (GRTA) apparatus or a lamp rapid thermal annealing (LRTA) apparatus may be used. Heat treatment may be performed more than once.

After the heat treatment, a high-purity oxygen gas, a high-purity $N_2O$ gas, or ultra-dry air (having a dew point of −40° C. or lower, preferably −60° C. or lower) is preferably introduced in the furnace where the heat treatment has been performed while the heating temperature is being maintained or being decreased. In this case, it is preferable that the oxygen gas or the $N_2O$ gas do not contain water, hydrogen, and the like. The purity of the oxygen gas or the $N_2O$ gas which is introduced into the heat treatment apparatus is preferably higher than or equal to 6N, more preferably higher than or equal to 7N. That is, the impurity concentration in the oxygen gas or the $N_2O$ gas is lower than or equal to 1 ppm, more preferably lower than or equal to 0.1 ppm. Through this step, oxygen is supplied to the oxide semiconductor layer, and oxygen vacancies in the oxide semiconductor layer can be suppressed. Note that the high-purity oxygen gas, high-purity $N_2O$ gas, or ultra-dry air may be introduced at the time of the above heat treatment.

The hydrogen concentration in the highly purified oxide semiconductor layer, measured by SIMS, is preferably less than or equal to $5\times10^{19}$ atoms/$cm^3$, more preferably less than or equal to $5\times10^{18}$ atoms/$cm^3$, and still more preferably less than or equal to $5\times10^{17}$ atoms/$cm^3$ or less.

With the use of the highly purified oxide semiconductor layer for a field-effect transistor, the carrier density of the oxide semiconductor layer can be lower than $1\times10^{14}$/$cm^3$, preferably lower than $1\times10^{12}$/$cm^3$, and more preferably lower than $1\times10^{11}$/$cm^3$. By reducing the carrier density in this way, the off-state current per micrometer of channel width of the field-effect transistor can be less than or equal to 10 aA ($1\times10^{-17}$ A), preferably less than or equal to 1 aA ($1\times10^{-18}$ A), more preferably less than or equal to 10 zA ($1\times10^{-20}$ A), still more preferably less than or equal to 1 zA ($1\times10^{-21}$ A), and most preferably less than or equal to 100 yA ($1\times10^{-22}$ A).

As the dopants contained in the regions 206a and 206b, it is possible to use, for example, one or more elements selected from Group 13 elements in the periodic table (e.g., boron), Group 15 elements in the periodic table (e.g., nitrogen, phosphorus, and arsenic), and rare gas elements (e.g., helium, argon, and xenon).

The insulating layers 210 and 256 each function as a gate insulating layer of the transistor. Each of the insulating layers 210 and 256 can be, for example, a layer containing a material such as gallium oxide, silicon oxide, silicon nitride, silicon oxynitride, silicon nitride oxide, aluminum oxide, aluminum nitride, aluminum oxynitride, aluminum nitride oxide, or hafnium oxide.

The conductive layers 212 and 252 each function as a gate of the transistor. Each of the conductive layers 212 and 252 can be, for example, a layer containing a metal material such as molybdenum, titanium, chromium, tantalum, magnesium, silver, tungsten, aluminum, copper, neodymium, or scandium.

Each of the insulating layers 214a, 214b, and 216 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layers 218a and 218b, the conductive layers 260a and 260b, and the conductive layers 262a and 262b each function as a source or a drain of the transistor. Each of the conductive layers 218a and 218b, the conductive layers 260a and 260b, and the conductive layers 262a and 262b can be, for example, a layer containing a conductive material such as molybdenum, titanium, chromium, tantalum, magnesium, silver, tungsten, aluminum, copper, neodymium, scandium, or ruthenium.

The insulating layers 220 and 264 each function as a protective layer. Each of the insulating layers 220 and 264 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

Figure 5:
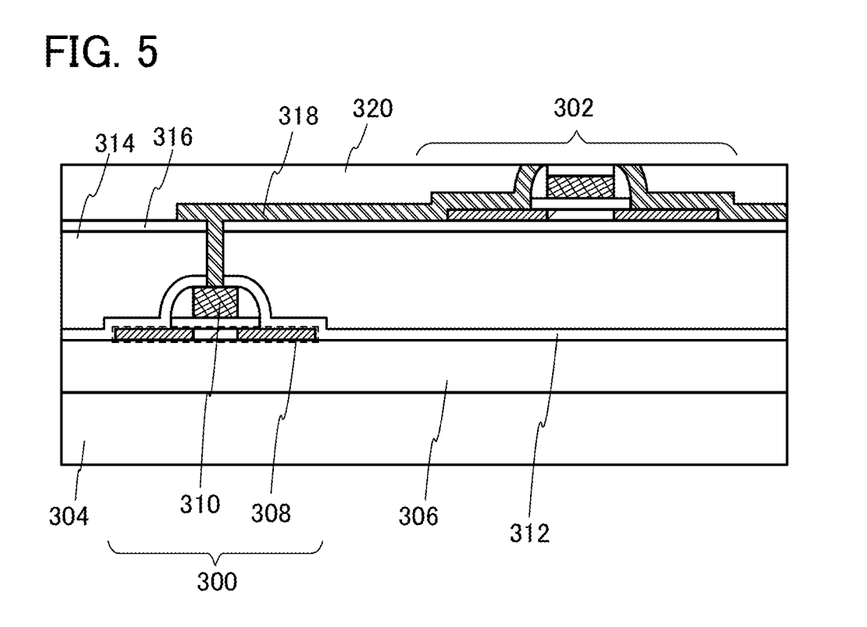
FIG. 5 is a cross-sectional view illustrating a semiconductor device which is one embodiment of the present invention.

Next, an example of the structure of a semiconductor device including the transistor illustrated in FIG. 4A will be described with reference to FIG. 5. FIG. 5 is a schematic cross-sectional view illustrating an example of the structure of the semiconductor device of this embodiment.

The semiconductor device illustrated in FIG. 5 includes a transistor 300 including a single crystal silicon layer 308 (also referred to as a silicon region) that is a channel formation layer, and a transistor 302 that is stacked over the transistor 300 with an insulating layer 312, an insulating layer 314, and an insulating layer 316 interposed therebetween and has the structure illustrated in FIG. 4A. Further, an insulating layer 320 is provided in contact with the transistor 302.

The single crystal silicon layer 308 is provided over a substrate 304 with an insulating layer 306 (also referred to as a BOX (buried oxide) layer) interposed therebetween. Note that the transistor 300 may be structured using a semiconductor region surrounded by a buried insulating region in a single crystal semiconductor substrate, instead of using the substrate 304, the insulating layer 306, and the single crystal silicon layer 308.

The insulating layer 312 functions as a protective layer. The insulating layer 314 functions not only as a protective layer but also as a planarization layer. The insulating layer 316 functions as a base layer. Each of the insulating layers 312, 314, and 316 can be a layer containing a material similar to that of the insulating layer 202.

A conductive layer 318 functioning as a source or a drain of the transistor 302 is connected to a conductive layer 310 functioning as a gate of the transistor 300. Note that the conductive layer 318 and the conductive layer 310 may be connected to each other through a plurality of conductive layers.

The use of the transistor with low off-state current as the transistor 302 increases the time in which the data in a memory cell is stored.

A logic circuit (including a volatile memory circuit) such as a CPU or a signal processing circuit can be configured using the transistor 300, which results in an increase in operation speed.

The transistor 300 in FIG. 5 corresponds to the first transistor 114, the second transistor 116, the third transistor 118, the fourth transistor 120, the fifth transistor 122, and the sixth transistor 124 which are described in Embodiment 1 with reference to FIG. 2. The transistor 302 in FIG. 5 corresponds to the seventh transistor 126 and the eighth transistor 128 which are described in Embodiment 1 with reference to FIG. 2. Thus, the conductive layer 318 in FIG. 5 functions as the first data storage portion 140 or the second data storage portion 142.

A transistor having low off-state current can be manufactured in the above described manner. Note that the transistor having low off-state current is not limited to the one described in this embodiment, and is not limited to a specific configuration as long as the transistor has an off-state current low enough to store data in a data storage portion for a required time. For example, a top-gate top-contact transistor may be used.

This application is based on Japanese Patent Application serial No. 2012-109286 filed with Japan Patent Office on May 11, 2012, the entire contents of which are hereby incorporated by reference.

What is claimed is:

1. A semiconductor device comprising a plurality of memory elements arranged in a matrix, each memory element including:
a first memory circuit comprising a first inverter, a second inverter, a first data storage portion and a second data storage portion; and
a second memory circuit comprising a third data storage portion,
wherein the first data storage portion is electrically connected to a bit line through a first transistor;
wherein the second data storage portion is electrically connected to an inverted bit line through a second transistor;
wherein the first transistor and the second transistor are electrically connected to a first word line;
wherein the third data storage portion is electrically connected to the second data storage portion through a third transistor;
wherein the third transistor is electrically connected to a second word line;
wherein the third data storage portion is electrically connected to one electrode of a capacitor;
wherein the other electrode of the capacitor is electrically connected to a low potential power source line;
wherein an input terminal of the first inverter and an output terminal of the second inverter are directly connected to the first transistor;
wherein an output terminal of the first inverter and an input terminal of the second inverter are directly connected to the second transistor;
wherein the second data storage portion is directly connected to the third transistor;
wherein the second memory circuit is configured to save data in the second data storage portion to the third data storage portion immediately before supply of power to the first memory circuit is stopped;
wherein the first data storage portion is not electrically connected to any circuit configured to save data in the first data storage portion before supply of power to the first memory circuit is stopped;
wherein the first data storage portion and the second data storage portion are configured to be precharged in restoring the first memory circuit, thereby reading data from the third data storage portion to the second data storage portion;
wherein each of the first transistor and the second transistor includes a silicon region; and
wherein the third transistor includes an oxide semiconductor region.

2. The semiconductor device according to claim 1, wherein the first data storage portion and the second data storage portion are precharged to a potential intermediate between a potential of a high potential power source line and a potential of the low potential power source line.

3. The semiconductor device according to claim 2, wherein the low potential power source line has a ground potential.

4. The semiconductor device according to claim 1, wherein the third transistor is provided over the first transistor and the second transistor.

5. An electronic device using the semiconductor device according to claim 1.

6. A semiconductor device comprising a plurality of memory elements arranged in a matrix, each memory element consisting of:
a first memory circuit comprising a first inverter, a second inverter, a first data storage portion and a second data storage portion; and
a second memory circuit consisting of a third transistor, a capacitor and a third data storage portion,
wherein the first data storage portion is electrically connected to a bit line through a first transistor;
wherein the second data storage portion is electrically connected to an inverted bit line through a second transistor;
wherein the first transistor and the second transistor are electrically connected to a first word line;
wherein the third data storage portion is electrically connected to the second data storage portion through the third transistor;
wherein the third transistor is electrically connected to a second word line;
wherein the third data storage portion is electrically connected to one electrode of the capacitor;
wherein the other electrode of the capacitor is electrically connected to a low potential power source line;
wherein an input terminal of the first inverter and an output terminal of the second inverter are directly connected to the first transistor;
wherein an output terminal of the first inverter and an input terminal of the second inverter are directly connected to the second transistor;

wherein the second data storage portion is directly connected to the third transistor;

wherein the second memory circuit is configured to save data in the second data storage portion to the third data storage portion immediately before supply of power to the first memory circuit is stopped;

wherein the first data storage portion and the second data storage portion are configured to be precharged in restoring the first memory circuit, thereby reading data from the third data storage portion to the second data storage portion;

wherein each of the first transistor and the second transistor includes a silicon region; and wherein the third transistor includes an oxide semiconductor region.

7. The semiconductor device according to claim 6, wherein the first data storage portion and the second data storage portion are precharged to a potential intermediate between a potential of a high potential power source line and a potential of the low potential power source line.

8. The semiconductor device according to claim 7, wherein the low potential power source line has a ground potential.

9. The semiconductor device according to claim 6, wherein the third transistor is provided over the first transistor and the second transistor.

10. An electronic device using the semiconductor device according to claim 6.

* * * * *